United States Patent [19]

Akiyama

[11] Patent Number: 4,899,105
[45] Date of Patent: Feb. 6, 1990

[54] METHOD OF TESTING ELECTRICAL CHARACTERISTICS OF LCD WITH PROBE DEVICE

[75] Inventor: Shuji Akiyama, Kofu, Japan

[73] Assignee: Tokyo Electron Limited, Tokyo, Japan

[21] Appl. No.: 239,677

[22] Filed: Sep. 2, 1988

[30] Foreign Application Priority Data

Sep. 2, 1987 [JP] Japan .................. 62-219639

[51] Int. Cl.$^4$ .......................................... G01R 31/26
[52] U.S. Cl. ............................... 324/158 F; 324/71.3; 324/158 R; 324/158 D
[58] Field of Search .......... 324/158 F, 158 P, 73 PC, 324/158 D, 158 R, 73 R, 71.3; 136/290; 250/310, 311, 492.2; 350/333, 332

[56] References Cited

U.S. PATENT DOCUMENTS

| | | | |
|---|---|---|---|
| 4,309,657 | 1/1982 | Lockhart, Jr. et al. | 324/158 R X |
| 4,393,348 | 7/1983 | Goldstein et al. | 324/158 D X |
| 4,656,419 | 4/1987 | Garlick | 324/158 D X |
| 4,712,063 | 12/1987 | Osterwald et al. | 324/158 R X |
| 4,715,687 | 12/1987 | Glass et al. | 350/332 |
| 4,728,174 | 3/1988 | Grinberg et al. | 350/332 |

*Primary Examiner*—Reinhard J. Eisenzopf
*Assistant Examiner*—Vinh P. Nguyen
*Attorney, Agent, or Firm*—Oblon, Spivak, McClelland, Maier & Neustadt

[57] ABSTRACT

A method of testing electrical characteristics with a probe device, wherein an object to be tested is placed on a table of the probe device, and the electrical characteristics of the object are measured while light is supplied from a light source unit outside the test unit to the test unit for the object through a light supplying means unit. A light source need not be arranged inside the test unit, thereby preventing the temperature atmosphere inside the test unit from being disturbed, and the electrical characteristics of the object can be tested under severe conditions with radiation of external light.

10 Claims, 10 Drawing Sheets

METHOD OF TESTING ELECTRICAL CHARACTERISTICS OF LCD WITH PROBE DEVICE

BACKGROUND OF THE INVENTION

1. Field of the Invention

The present invention relates to a method of testing electrical characteristics with a probe device.

2. Description of the Prior Art

In recent years, techniques are being completed for manufacturing large liquid crystal boards (hereinafter referred to as LCDs (Liquid Charged Devices)), each constituting a television screen or the like. Further, a mass-production of LCDs is developing rapidly. But, it is desired that a probe device for testing electrical characteristics of mass-produced LCDs be developed.

LCD electrical characteristics are conventionally tested using a probe card or a tester. However, strong demand has arisen for testing LCD electrical characteristics under severe conditions upon radiation of external light on an LCD.

A visible condition of an image displayed on the screen of an LCD is greatly changed due to a state of light emitted thereon. In other words, the LCD cannot be tested whether to be normal without light radiation on the LCD.

However, no conventional methods are available to test the LCD electrical characteristics with light radiation on the LCD. In order to test the LCD electrical characteristics under severe conditions (i.e., light radiation on the LCD) and LCD is mounted in a jig and is energized. External light is then incident on the LCD, and the LCD is tested whether to be normal by observation with a naked eye.

It is possible to test LCD electrical characteristics under severe conditions with light radiation if a light source is arranged in a test unit of a probe device. However, heat is dissipated from the light source to disturb a temperature atmosphere inside the test unit. In addition, a space is required in the test unit to receive the light source. Furthermore, various problems are posed in practical applications.

OBJECT OF THE INVENTION

It is an object of the present invention to provide a method of testing electrical characteristics with a probe device in a test unit, wherein an object to be tested under severe conditions with external light can be tested, no space for a light source is required in the test unit, and a temperature atmosphere inside the test unit is not disturbed.

SUMMARY OF THE INVENTION

In order to achieve the above object of the present invention, there is provided a method of testing electrical characteristics with a probe device, comprising the steps of:

placing an object to be tested on a stage inside the probe device;

setting a light output end of light supplying means to oppose a test unit for the object;

guiding light from a light source unit outside the test unit to a light incident end of the light supplying means; and testing the electrical characteristics while light is kept supplied from the light output end to the test unit.

The object to be tested in the present invention is, e.g., a liquid crystal display device.

The light supplying means comprises, e.g., an optical fiber cable.

The light output end of the light supplying means is preferably supported inside a table so as to oppose the support surface of the table.

An incident end portion of the light supplying means is preferably flexed and inserted between the test unit and the light source unit, and the light supplying means is preferably operated in response to movement of the table due to flexure of the light supplying means.

According to the present invention, light emitted from the light source unit is incident on the incident end of the light supplying means and is transmitted along the light supplying means.

Light is output from the output end located inside the test unit so that the liquid crystal display device placed on the table is irradiated with light.

Since light from the light supplying means is utilized, the same severe atmosphere as radiation of external light on the liquid crystal display device can be produced. In this case, the electrical characteristics of the liquid crystal display device can be tested with external light by observation of an image with a naked eye.

In particular, according to the present invention, the liquid crystal display device is irradiated with external light emitted from the light source unit outside the test unit and guided to the test unit through the light supplying means. For this reason, a space for a light source unit is not required in the test unit. In addition, the temperature atmosphere inside the test unit cannot be disturbed, and the electrical characteristics of the object can be easily tested.

DETAILED DESCRIPTION OF THE PREFERRED EMBODIMENTS

Figure 1A:
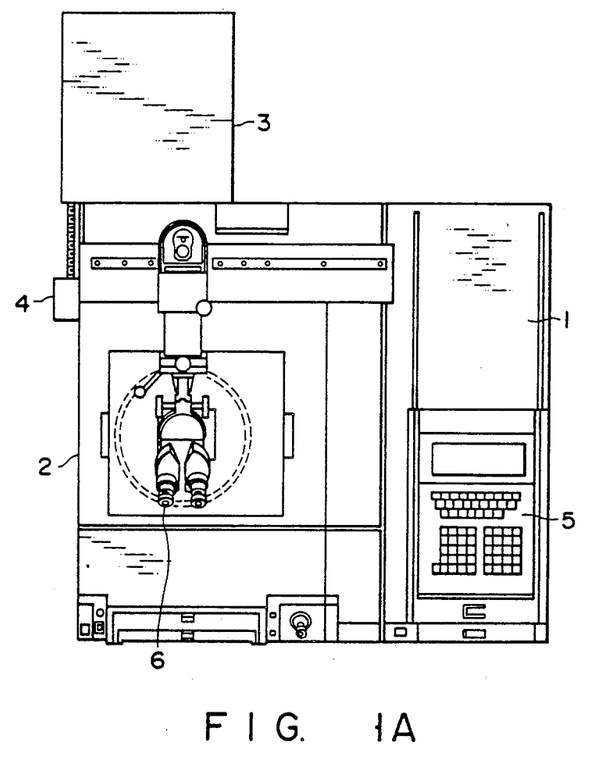
FIG. 1A is a plan view showing a probe device used to practice a method of the present invention.
Figure 1B:
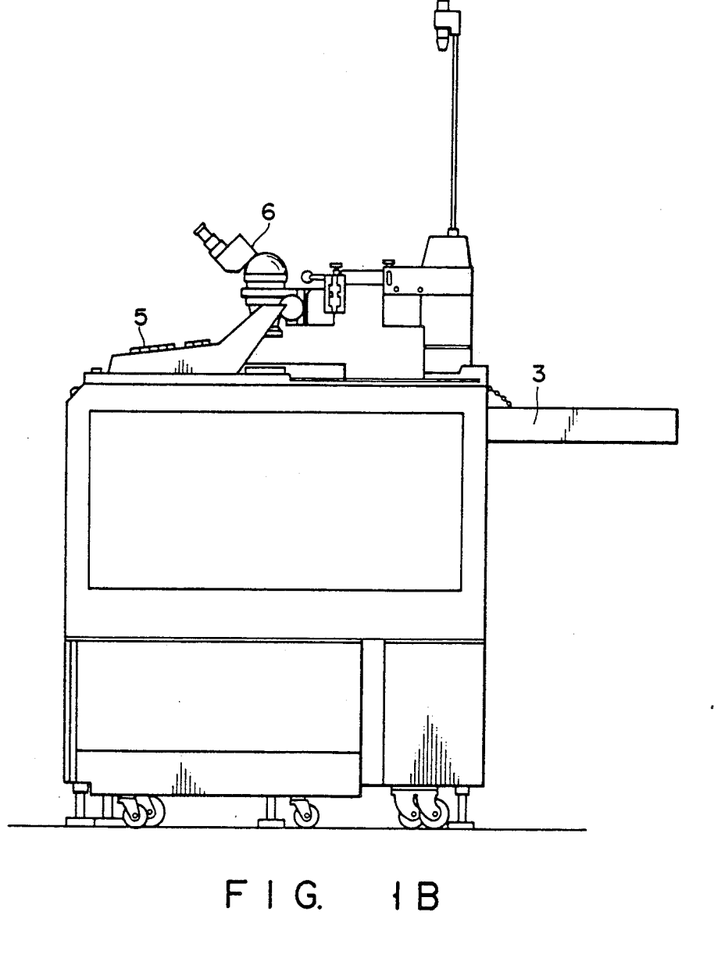
FIG. 1B is a side view of the probe device shown in FIG. 1A.

Preferred embodiments will be described below wherein a method of the present invention is applied to characteristic testing of an LCD serving as a liquid crystal display device. FIG. 1A is a plan view showing a probe device used to practice the method of the present invention, and FIG. 1B is a side view thereof.

The probe device comprises a loader 1, a test unit 2, a fiber storage box assembly 3, and a light source unit 4.

The loader 1 takes out an LCD from a cassette, prealigns the LCD, and transfers it to the test unit 2. The loader 1 then receives the tested LCD and stores it in the corresponding cassette.

The cassette stores a large number of, e.g., 5" diameter LCDs stacked therein at predetermined intervals. A keyboard 5 is arranged on the upper surface of the loader 1. The keyboard 5 is used to input predetermined information to operate the probe device.

The test unit 2 receives the LCD conveyed from the loader 1 and fixes it on a chuck. The test unit 2 controls and drives the chuck in the X, Y, and $\theta$ directions to align the LCD. The electrical characteristics of the LCD are tested with a probe card or a sensor.

A scope 6 is arranged in a direction of the test unit 2. The scope 6 is used to allow an operator to observe a positioning state of the LCD with his or her eyes.

Figure 2A:
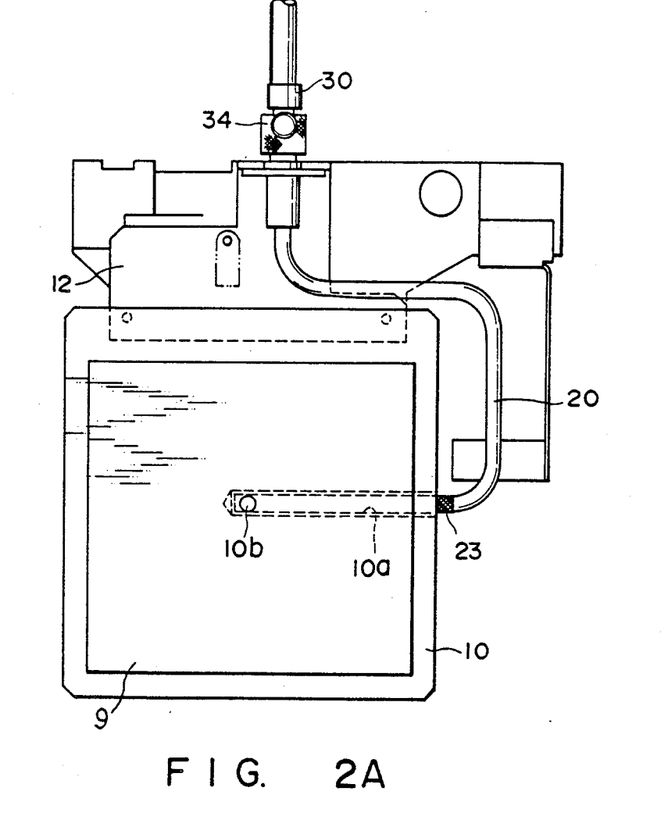
FIG. 2A is a plan view showing a chuck with an optical fiber cable.
Figure 2B:
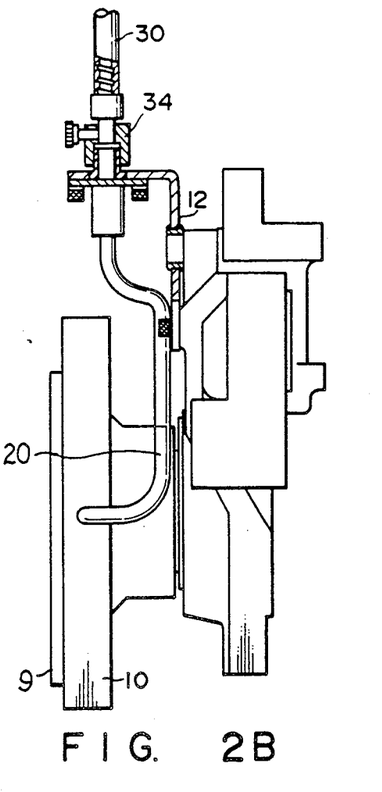
FIG. 2B is a side view of the chuck shown in FIG. 2A.

The test unit 2 will be described in more detail with reference to FIGS. 2A and 2B.

Reference numeral 10 denotes a chuck serving as a table for fixing an LCD 9 thereon. A fiber mounting hole 10a is formed from the side surface of the chuck 10 to the center thereof. A light output hole 10b is formed at the center of the chuck 10 and communicates with the fiber mounting hole 10a.

An output fiber probe 20 is mounted to the test unit 2. One end of the output fiber probe 20 faces the light output hole 10b through the fiber mounting hole 10a. The other end of the output fiber probe 20 is fixed to a fiber mounting plate 12.

Figure 3:
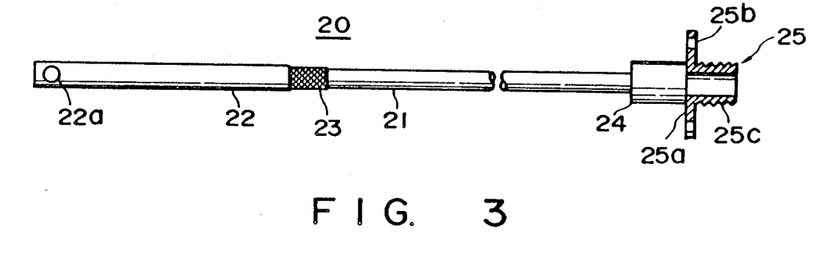
FIG. 3 is a schematic view for explaining an output fiber probe.

As shown in FIG. 3, the output fiber probe 20 is arranged such that a plurality of fibers are bundled and stored in a tube 21. An output metal piece 22 is mounted at one end of the tube 21. The output metal piece 22 has a hole 22a. The position of the hole 22a corresponds to the light output hole 10b when the output fiber probe 20 is inserted in the fiber mounting hole 10a. A reinforcing tube 23 is mounted on the tube 21 at a position near the outlet portion of the fiber mounting hole 10a.

A plug 25 is mounted on the other end of the tube 21 through a joint connector 24. A plurality of holes 25b are formed in a flange 25a of the plug 25.

The output fiber probe 20 is fixed to the fiber mounting plate 12 by screws (not shown) engaged with the holes 25b. A male thread 25c is formed on the outer surface of the plug 25.

Figure 4:
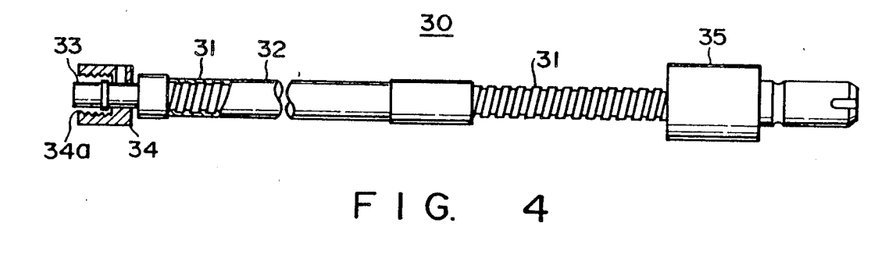
FIG. 4 is a schematic view for explaining an incident fiber probe.

The plug 25 is connected to an incident fiber probe 30. The incident fiber probe 30 and the output fiber probe 20 constitute an optical fiber cable.

The incident fiber probe 30 has a structure shown in FIG. 4. A plurality of fibers are bundled and covered with a flexible tube 31. The flexible tube 31 is made of, e.g., a polyethylene tube 32. The length of the incident fiber probe 30 is set to be the distance from the fiber mounting plate 12 to the light source unit 4. A joint connector 33 is mounted on a connecting portion between the incident fiber probe 30 an the output fiber probe 20. A cap nut 34 constituting female thread 34a on the inner surface of the cylindrical portion of the cap nut 34 is mounted on the joint connector 33. The female thread 34a is threadably engaged with the male thread 25c of the plug 25. Upon this threadable engagement, the incident fiber probe 30 is coupled to the output fiber probe 20. A metal piece 35 is mounted on the incident fiber probe 30 on the light source side.

Figure 5:
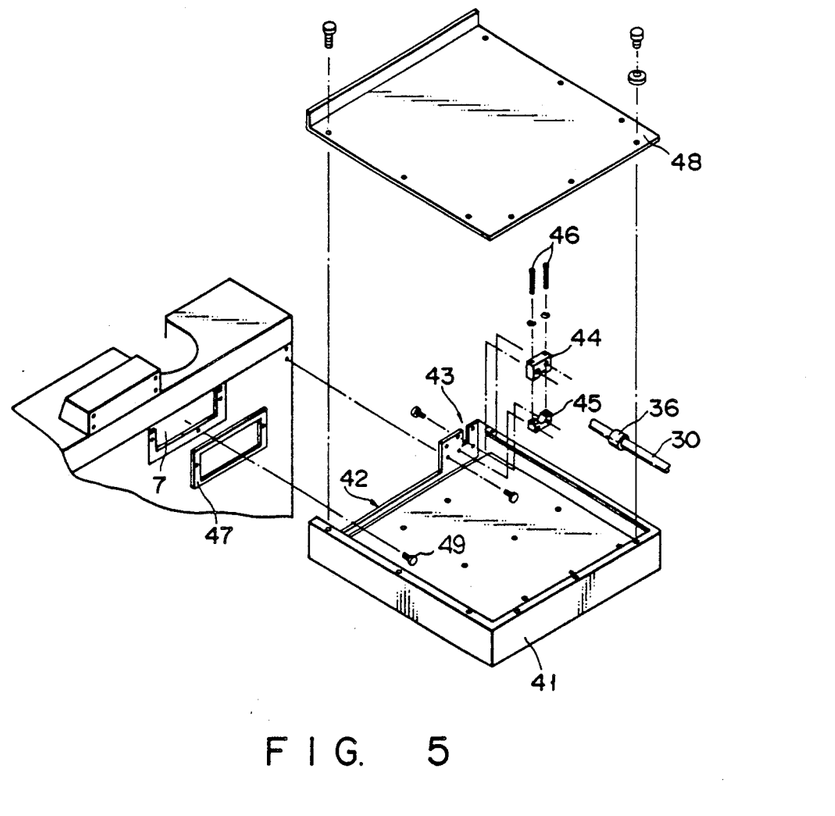
FIG. 5 is a perspective view showing a fiber storage box assembly.

The fiber storage box assembly 3 will be described with reference to FIG. 5.

The fiber storage box assembly 3 stores the incident fiber probe 30 flexed in a U shape and guides the incident fiber probe 30 to the light source unit 4. The incident fiber probe 30 is guided outside the probe device through an opening 7. The opening 7 is formed on the rear surface of the probe device.

The incident fiber probe 30 is stored in a box 41 in a flexed state. The box 41 comprises a first notch 42 at a position opposite to the opening 7. The incident fiber probe 30 is guided in the box 41 through the first notch 42. The incident fiber probe 30 is guided to the light source unit 4 through a second notch 43. The second notch 43 is formed at a corner of the same surface in which the first notch 42 is formed.

A fixing block 44 and a fixing block 45 are fixed inside the second notch 43. The incident fiber probe 30 is supported and clamped between the fixing block 44 and the fixing block 45. In this case, incident fiber probe portion mounted with a shield sponge 36 is clamped between the fixing block 44 and the fixing block 45 and fixed by a plurality of screws 46.

The box 41 is fixed on the rear surface of the probe device through a reinforcing plate 47 by a plurality of screws 49. The upper surface of the box 41 is closed by a cover 48.

The light source unit 4 will be described below. The internal structure of the light source unit 4 is not illustrated. The metal piece 35 of the incident fiber probe 30 on the light source unit side can be jointed. A light source is arranged to oppose the incident fiber probe 30. The light source comprises, e.g., a halogen lamp with a dichroic mirror.

The intensity of the halogen lamp can vary in the range of 0 to 100% according to, e.g., a PWM scheme. The ON/OFF operation of the halogen lamp is performed by, e.g., opening/closing a mechanical shutter. For example, when two filters are mounted on the light source, a maximum of 25 intensity levels can be obtained. In this case, one filter consists of five types of filters. In order to suppress heating of the halogen lamp, forced cooling using, e.g., a fan can be performed.

The light source unit 4 may be automatically or manually driven. In automatic driving, the shutter is opened/closed and the filters are selectively operated in accordance with the data sent from the probe device. In manual driving, the shutter is opened/closed and the filters are selectively operated upon operation of a panel switch of a light source controller arranged in the light source unit 4.

A method of testing LCD characteristics with the probe device having the above arrangement according to the present invention will now be described.

Figure 6:
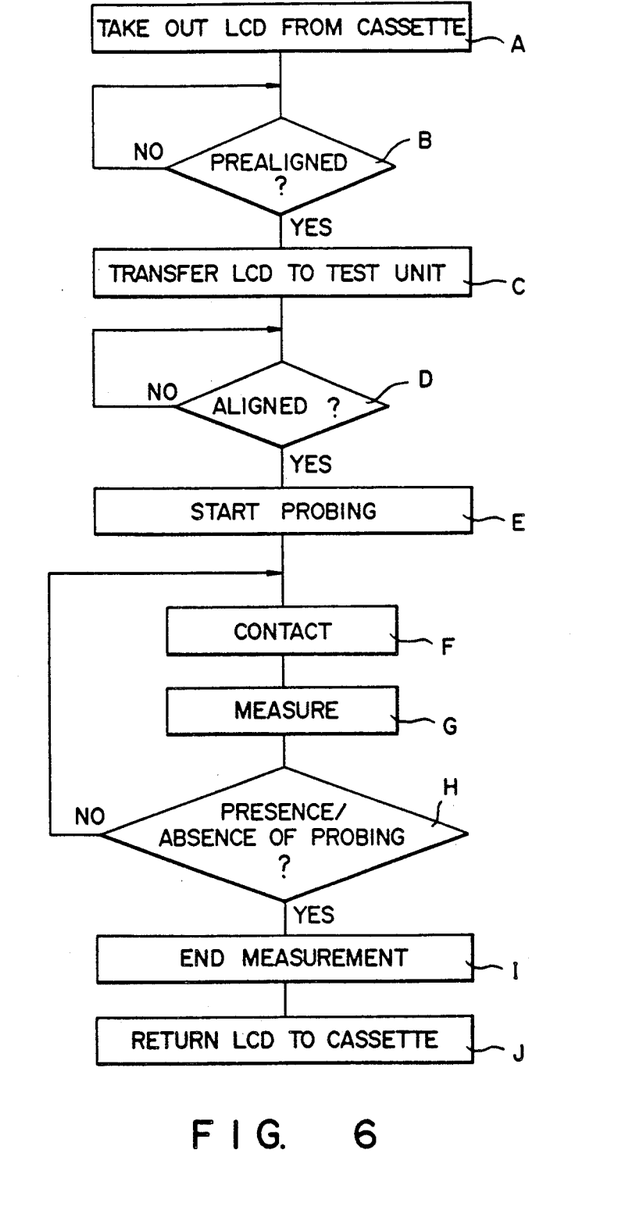
FIG. 6 is a view for explaining the steps in testing the object according to the method of the present invention.

The test steps of the method of the present invention will be described with reference to FIG. 6.

An LCD is taken out of a cassette (step A). Centering of the LCD is performed (prealignment) (step B). The centered is transferred to the test unit (step C). The test unit performs LCD alignment on a test stage (step D). In this alignment, the three-dimensional position of the LCD to be measured is adjusted by an X-Y table and a $\theta$ rotating mechanism. Probe tips are matched with a reference chip with a joy stick.

Probing of the LCD is started (step E). The probe tips are brought into contact with many lead electrodes on the LCD (step F). That is, a plurality of probe tips arranged on the probe card are respectively brought into contact with LCD electrodes. In this state, a preprogrammed measuring signal is supplied to the probe card, and the LCD is irradiated with external light guided through the optical fiber cable. A measuring step is then started (step G). Thereafter, the presence/absence of probing is checked (step H). The measurement is completed (step I), and the LCD is returned to the cassette (step J).

The flow of the method of the present invention using the above device will be described in more detail.

The loader 1 removes one LCD 9 from a cassette, prealigns it, and transfers the prealigned LCD 9 to the test unit 2. The test unit 2 places and fixes the LCD 9 on the chuck 10 by, e.g., vacuum suction and causes the Y—Y table and the θ rotating mechanism to align the LCD 9. The probe tips arranged on the probe card are brought into contact with the LCD 9 electrodes, respectively. The LCD is energized to test its electrical characteristics.

Subsequently, the halogen lamp in the light source unit 4 is turned on, and the mechanical shutter is opened. Light from the halogen lamp is incident from one end of the incident fiber probe 30.

The incident fiber probe 30 is guided inside the probe device through the fiber storage box assembly 3.

The incident fiber probe 30 is connected to the plug 25 of the output fiber probe 20 at a position of the fiber mounting plate 12 fixed to the chuck 10. Light is transmitted from the incident fiber probe 30 to the output fiber probe 20.

The output end portion of the output fiber probe 20 is inserted and supported in the fiber mounting hole 10a of the chuck 10. The hole 22a of the light output portion of the output fiber probe 20 opposes the light output hole 10b located at the center of the chuck 10. The lower surface of the LCD 9 is irradiated with light emitted from the halogen lamp through the light output hole 10b. The illuminance of the output light can be assured to be about 50,000 lx. A higher illuminance can be obtained by changing the arrangement of the light source unit 4 and the diameter of the fiber cable.

An LCD is generally transparent. Light incident on the lower surface of the LCD produces severe conditions as if external light is directly incident on the upper surface of the LCD. While the lower surface of the LCD is being irradiated with light, the operator can visually check a predetermined pattern displayed on the screen of the LCD. As a result, the electrical characteristics of the LCD can be easily tested with radiation of external light.

The LCD 9 may be tested while the LCD 9 mounted on the chuck 10 is moved to a position where it is bought into contact with probe tips. In this case, the optical fibers fixed to the chuck 10 must be moved in response to movement of the chuck 10.

Movement of the chuck 10 is performed on a two-dimensional plane by setting positions indicated by the solid lines and the alternate long and two short dashed lines with respect to a central position a (FIG. 7) of the chuck 10.

In the probe device of this embodiment, the fiber storage box assembly 3 is arranged to satisfy the above need. The incident fiber probe 30 is flexed in a U shape in the fiber storage box assembly 3. As indicated by reference symbol A in FIG. 7, when the chuck 10 is moved to the farthest position, flexure of the incident fiber probe 30 inside the fiber storage box assembly 3 is minimum. However, when the chuck 10 is moved to the nearest position, as indicated by reference symbol B or C, the flexure of the incident fiber probe 30 is maximum. In this manner, the flexure of the incident fiber probe 30 inside the fiber storage box assembly 3 is determined.

Figure 7:
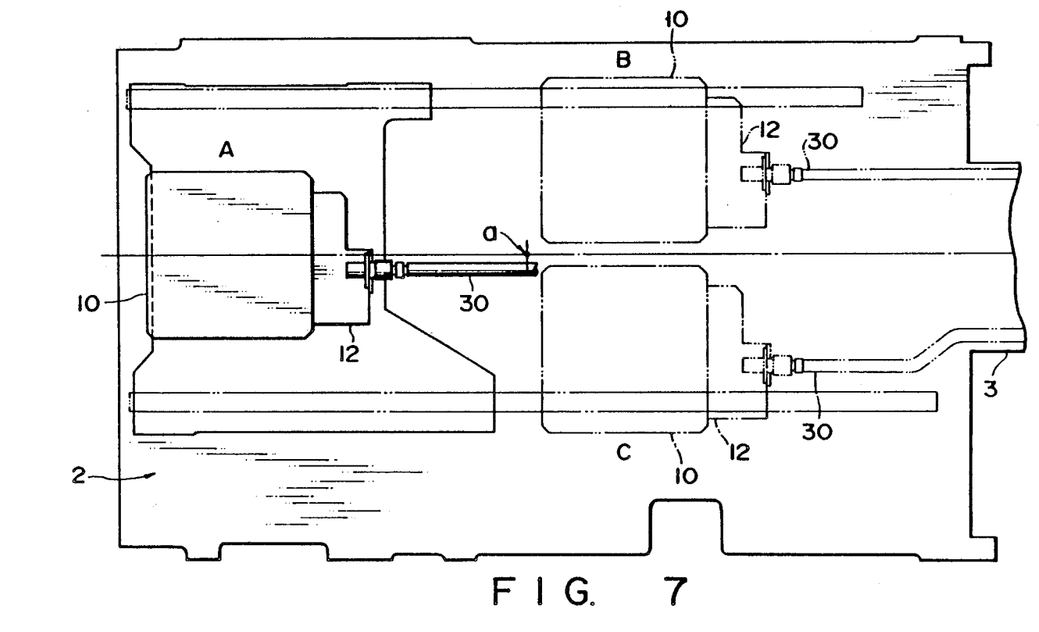
FIG. 7 is a plan view showing chuck movement and optical fiber layout.

The optical fiber itself is predetermined strength, so that the incident fiber probe 30 can be slidably moved inside the fiber storage box assembly 3 upon movement of the chuck 10. For example, a minimum radius of the flexed fiber probe is set to be 40 to 50 mm, and a maximum radius of the flexed fiber probe is set to be 120 to 140 mm. Therefore, the incident fiber probe 30 can be moved to any position upon movement of the chuck 10.

In order to assure slidable movement of the incident fiber probe 30 inside the fiber storage box assembly 3, a sheet (e.g., Sonitac (tradename)) for reducing frictional resistance can be adhered to the inner bottom surface of the box 41.

In the above embodiment, the means for supporting the optical fiber cable inside the test unit 2 is fixed inside the chuck 10, and the lower surface of the object is irradiated with light. However, the present invention is not limited to this arrangement.

Although the above embodiment is advantageous in that the optical fiber cable is supported by the chuck 10 and the object can always be irradiated with light regardless of the position of the chuck 10, the light output end of the optical fiber probe may be fixed above the object to obtain the same atmosphere as radiation of external light.

The number of optical fiber cables arranged in the test unit 2 is not limited to one but may be two or more. The optical fiber cable may be located below or above the object.

Figure 8A:
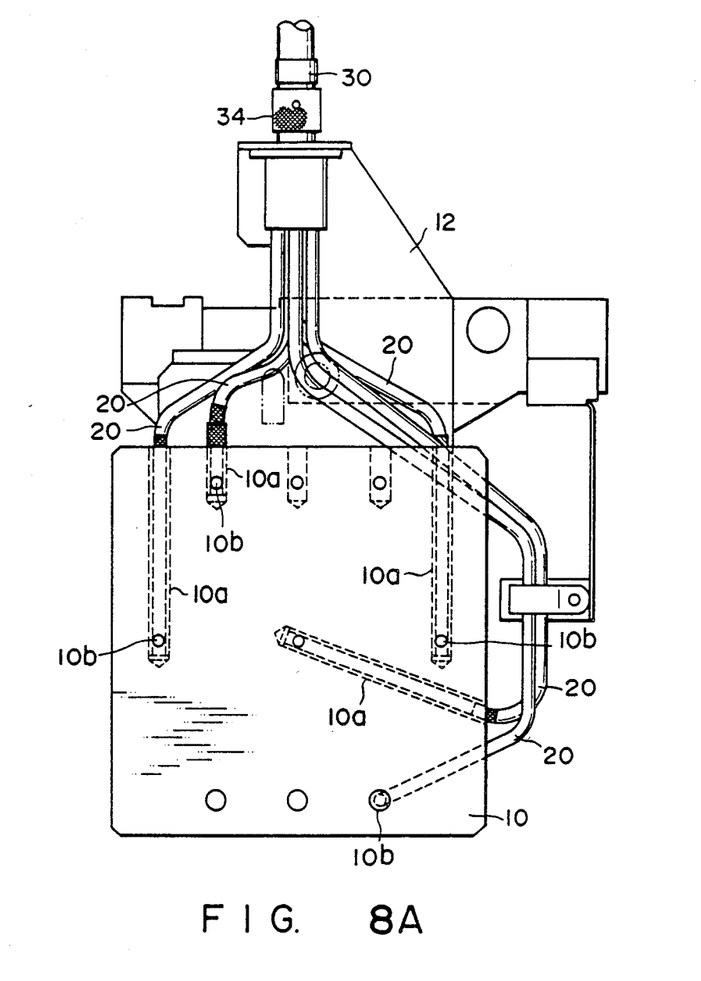
FIG. 8A is a plan view showing a chuck with a plurality of optical fiber cables according to another embodiment of the present invention.
Figure 8B:
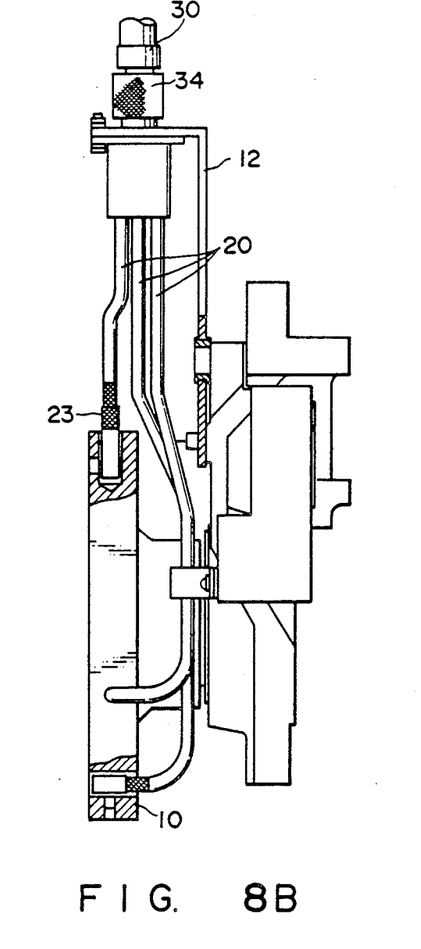
FIG. 8B is a side view of the chuck shown in FIG. 8A.

FIGS. 8A and 8B show another embodiment having five optical fiber cables in the chuck 10. In this case, light can be output to the center and the peripheral portions of the chuck 10.

The shape of the optical fiber cable, and the internal arrangement of the fiber storage box assembly 3 are only illustrative examples. Other shapes and structures may also be utilized.

Figure 9:
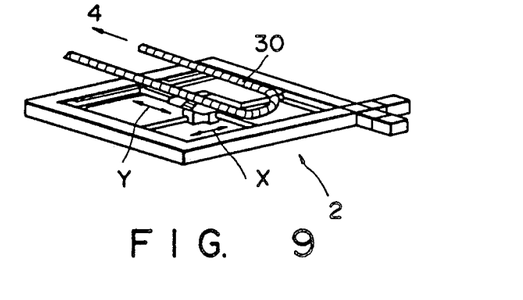
FIG. 9 is a view for explaining an X-Y slide mechanism mounted on a fiber storage box assembly.

As shown in FIG. 9, an X-Y slide mechanism may be mounted inside the fiber storage box assembly 3 so that an X-Y stage may be interlocked with the fiber storage box assembly 3. In this case, the X-Y slide mechanism is freely moved upon movement of the X-Y stage (test unit). Alternatively, the X-Y slide mechanism may be driven by a motor upon movement of the X-Y stage (test unit).

What is claimed is:

1. A method of testing electrical characteristics of an object with a probe device, said method comprising the steps of:
   (a) placing an object to be tested on a stage inside the probe device;
   (b) setting a light output end of a light supplying means to opposite the object;
   (c) guiding light from a light source unit outside the probe device to a light incident end of the light supplying means; and
   (d) testing the electrical characteristics of the object while light is kept supplied from the light output end of the light supplying means,
wherein:

(e) the light output end of the light supplying means is supported inside the stage so as to oppose a support surface of the stage.

2. A method according to claim 1, wherein the light supplying means comprises an optical fiber cable.

3. A method according to claim 1, wherein the object comprises a liquid crystal display device.

4. A method of testing electrical characteristics of an object with a probe device, said method comprising the steps of:
   (a) placing an object to be tested on a stage inside the probe device;
   (b) setting a light output end of a light supplying means to oppose the object;
   (c) guiding light from a light source unit outside the probe device to a light incident end of the light supplying means; and
   (d) testing the electrical characteristics of the object while light is kept supplied from the light output end of the light supplying means,
wherein:
   (e) an incident end portion of the light supplying means is located between the probe device and the light source unit in a flexed state; and
   (f) the light supplying means is moved in response to movement of the stage due to flexure of the light supplying means, wherein:
   (g) the light output end of the light supplying means is supported inside the stage so as to oppose a support surface of the stage.

5. A method according to claim 4, wherein the light supplying means comprises an optical fiber cable.

6. A method according to claim 4, wherein the object comprises a liquid crystal display device.

7. A method of testing electrical characteristics by means of a probe device, comprising the steps of:
   (a) placing an object to be tested on a table located in a testing region within the probe device;
   (b) positioning a light output end of an optical fiber cable to oppose said object;
   (c) guiding light from a light source unit located outside of said testing region to a light incident end of said optical fiber cable; and
   (d) testing the electrical characteristics in accordance with the amount of said light being supplied from said light output end to said object, wherein:
   (e) the light output end of the light supplying means is supported inside the stage so as to oppose a support surface of the stage.

8. A method according to claim 7, wherein an incident end portion of the optical fiber cable is located, in a flexed state, between the testing region and the light source unit, and the optical fiber cable is moved in response to movement of the table due to flexure of the optical fiber cable.

9. A method of testing electrical characteristics by means of a probe device, comprising the steps of:
   (a) placing a liquid crystal display device to be tested on a table located in a testing region within the probe device;
   (b) positioning a light output end of an optical fiber cable inside said table so as to oppose a support surface of said table;
   (c) guiding light from a light source unit located outside of the testing region to a light incident end of the light supplying means; and
   (d) testing the electrical characteristics in accordance with the amount of said light being supplied from said light output end to said object.

10. A method according to claim 9, wherein an incident end portion of the optical fiber cable is located, in a flexed state, between the testing region and the light source unit, and the optical fiber cable is moved in response to movement of the table due to flexure of the optical fiber cable.

* * * * *